United States Patent
Singh et al.

(10) Patent No.: US 8,828,874 B2
(45) Date of Patent: Sep. 9, 2014

(54) CHEMICAL MECHANICAL POLISHING OF GROUP III-NITRIDE SURFACES

(75) Inventors: Rajiv K. Singh, Newberry, FL (US); Arul Chakkaravarthi Arjunan, Gainesville, FL (US); Deepika Singh, Newberry, FL (US); Abhudaya Mishra, Gainesville, FL (US)

(73) Assignees: Sinmat, Inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 249 days.

(21) Appl. No.: 13/073,582

(22) Filed: Mar. 28, 2011

(65) Prior Publication Data

US 2012/0252213 A1 Oct. 4, 2012

(51) Int. Cl.
*H01L 21/302* (2006.01)
*H01L 21/461* (2006.01)
*C09G 1/02* (2006.01)
*C09K 3/14* (2006.01)
*H01L 21/02* (2006.01)

(52) U.S. Cl.
CPC ............ *C09K 3/1463* (2013.01); *C09G 1/02* (2013.01); *H01L 21/02024* (2013.01)
USPC ............ 438/690; 438/691; 438/692; 438/693

(58) Field of Classification Search
None
See application file for complete search history.

(56) References Cited

U.S. PATENT DOCUMENTS

| | | | |
|---|---|---|---|
| 6,464,740 | B1 | 10/2002 | Towery et al. |
| 6,835,120 | B1 | 12/2004 | Matsui |
| 7,176,115 | B2 | 2/2007 | Kitaoka et al. |
| 7,221,037 | B2 | 5/2007 | Kitaoka et al. |
| 2004/0060502 | A1 | 4/2004 | Singh |
| 2009/0273060 | A1* | 11/2009 | Ishibashi et al. ............... 257/615 |
| 2009/0317638 | A1* | 12/2009 | Kawabata et al. ............ 428/409 |
| 2010/0224963 | A1* | 9/2010 | Ishibashi et al. ............... 257/615 |
| 2010/0227532 | A1* | 9/2010 | Ishibashi et al. ................ 451/36 |
| 2010/0258528 | A1 | 10/2010 | Singh et al. |
| 2011/0133209 | A1* | 6/2011 | Ishibashi et al. ................ 257/76 |
| 2011/0146565 | A1 | 6/2011 | Ishibashi et al. |

FOREIGN PATENT DOCUMENTS

| | | |
|---|---|---|
| JP | 2008068390 | 3/2008 |
| WO | 2009046293 | 4/2009 |

OTHER PUBLICATIONS

Tohru Hara, et al., "Mechanism of Mechanical and Chemical Polishing in Low Dielectric Constant Plasma-Enhanced Chemical Vapor Deposition SiOC Layer from Hexamethyldisiloxane", Electrochemical and Solid-State Letters, G65-G67 (2001).

David R. Lide, Ph.D., Editor-in-Chief, et al., "CRC Handbook of Chemistry and Physics: A Ready-Reference Book of Chemical and Physical Data", Feb. 23, 1997, Title Page and pp. 8-20 to 8-30.

* cited by examiner

*Primary Examiner* — Duy Deo
(74) *Attorney, Agent, or Firm* — Jetter & Associates, P.A.

(57) ABSTRACT

A method of chemically-mechanically polishing a substrate having a Group III-nitride surface includes providing a chemical-mechanical polishing slurry composition. The slurry composition includes a slurry solution including a liquid carrier and an oxidizer including a transition metal or a per-based compound. The slurry solution includes at least one component that reacts with the Group III-nitride surface to form a softened Group III-nitride surface. The Group III-nitride comprising surface is contacted with the slurry composition by a pad to form the softened Group III-nitride surface. The pad is moved relative to the softened Group III-nitride surface, wherein at least a portion of the softened Group III-nitride surface is removed.

15 Claims, 1 Drawing Sheet

Method 100

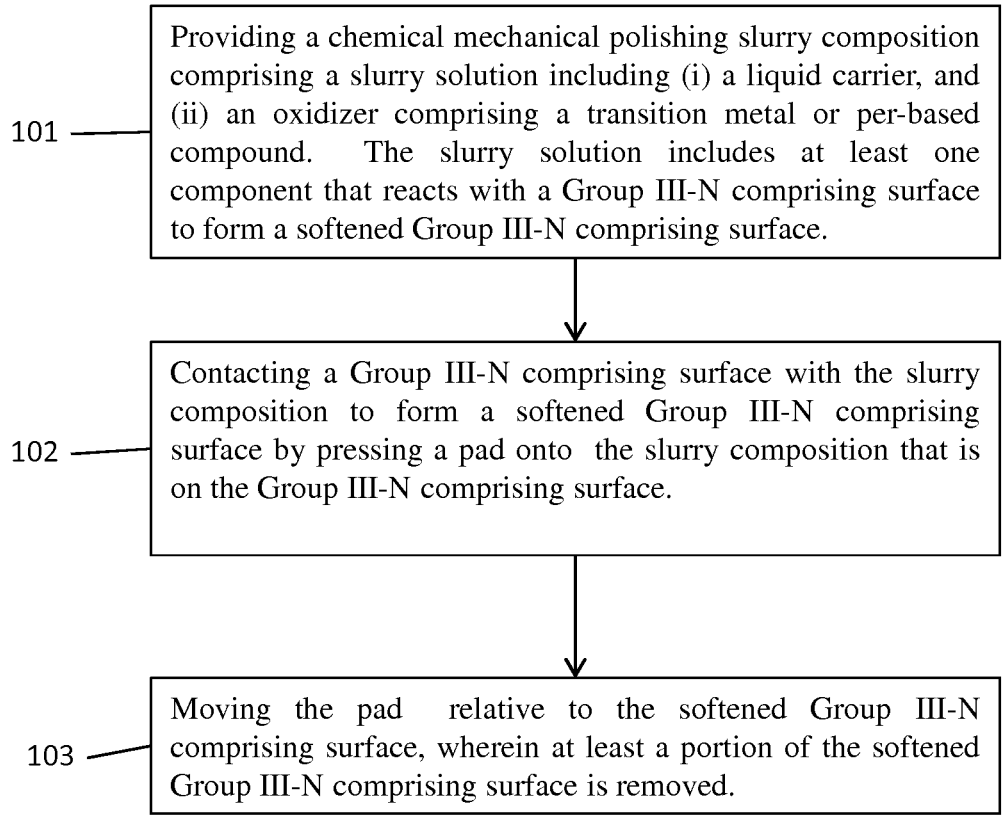
Method 100

CHEMICAL MECHANICAL POLISHING OF GROUP III-NITRIDE SURFACES

FIELD

Disclosed embodiments relate to chemical mechanical polishing (CMP) for group III-nitride compound semiconductor materials.

BACKGROUND

Gallium nitride, aluminum nitride, and more generally group III-nitrides have unique properties for electronic and optoelectronic applications. These materials can be used in single crystal, polycrystalline, or amorphous form. Such materials can be used either as substrates, or in thin or thick film form. One important challenge for group III-nitrides is to polish while minimizing surface and sub-surface damage.

SUMMARY

Disclosed embodiments include slurry compositions and chemically activated CMP methods for polishing a substrate having a group III-nitride (group III-N) comprising surface using such slurries. The group III-N materials can comprise materials including, but not limited to, BN, AN, GaN, AlGaN and InN, and its ternary and quaternary mixtures.

The group III-N comprising surface is contacted with a CMP slurry composition by a pressing pad that comprises a slurry solution comprising i) a liquid (e.g., water) carrier, (ii) and an oxidizer comprising a transition metal element or a per-based compound, along with optional slurry particles. A per-based compound is a compound that includes an element in its highest oxidation state. Some per-based oxidizer compounds include transition metal elements, such as permanganate and non-transition elements such as perchlorate. The slurry solution includes at least one component that reacts with the Group III-nitride comprising surface to form a softened Group III-nitride comprising surface. The pad is moved relative to the softened Group III-N comprising surface to remove at least a portion of the softened Group III-N comprising surface. During the moving step the softened Group III-nitride comprising surface may continue to form.

Examples of transition metal elements include, but are not limited to, cerium, manganese, chromium, titanium, iron, cobalt, copper, zinc, nickel, vanadium etc. Examples of per-based compound oxidizers includes Potassium Permanganate: $KMnO_4$, Potassium Perchlorate: $KClO_4$, Potassium Periodate: $KIO_4$, Potassium Perbromate: $KBrO_4$, Potassium Peroxide: $K_2O_2$, Potassium Peroxoborate: $KBO_3$, Potassium Peroxochromate: $K_3CrO_8$, Potassium Peroxodicarbonate: $K_2C_2O_6$, Potassium Peroxodisulfate: $K_2S_2O_8$, Potassium Perrhenate: $KReO_4$, Potassium peroxymono sulfate: $KHSO_5$, Potassium Ortho Periodate: $K_5IO_5$, Potassium peroxomonosulfate (or Peroxymonosulfate): $K_2SO_5$. The oxidation state of manganese in permanganate is +7, which is the highest oxidation state for manganese. Similarly the oxidation state for chlorine in chlorate is +7, which is its highest oxidation state.

The oxidation state of the transition metal or per-based oxidizer can be at least +3, or higher. Examples of +3 or higher oxidation state transition metals include $V^{3+, 4+, 5+}$, $Ti^{3+,4+}$, $Cr^{3+, 6+}$, $Mn^{+3+, 4+, 7+}$, $Fe^{3+}$, $Ni^{3+}$, $Co^{3+}$, $Mo^{3+,4+,5+,6+}$, $Ru^{3+,3+}$, $Pd^{4+}$, $Ta^{4+, 5+}$, $W^{6+}$, $Re^{4+,6+,7+}$, $Au^{3+}$, and $Zr^{4+}$.

In one embodiment the transition metal or per-based oxidizers break down into insoluble byproducts during the polishing process. The term "byproducts" as used herein refers to insoluble compounds formed during the CMP process from either the breakdown of the oxidizers or the group III-Nitride reactant surfaces that can be deposited on the polishing pad and become the part of the slurry. Example insoluble byproducts that can be formed during the polishing process include, but are not limited to, $MnO_2$, $Mn_2O_3$, PbO, $V_2O_3$, $TiO_2$, $Ta_2O_5$, $Cr_2O_3$, $Ta_2O_5$, $TaO_2$, $WO_3$, $ZrO_2$, $PdO_2$ and PdO. The presence of insoluble compounds along with the oxidizer can help accelerate catalytic breakdown of the oxidizer during the polishing process. The insoluble byproducts can also coat the polishing pad and form a thin particle layer thereon that can increase the removal rate by accelerating the oxidation rate of the surface being polished during the polishing process.

In one embodiment, a pad pressure of at least 0.5 psi is used during the moving step. The rate of formation of the softened Group III-nitride comprising surface can be accelerated by moving the pad across the Group III-nitride comprising surface with linear speeds greater than 0.05 m/sec or rounds per minute greater than 5.

The pH of the slurry can be varied in a range from 0.1 to pH 13. Optionally, slurry particles can be included. The particles can be soft particles or hard particles. Soft particles are defined herein as particles which have a Mohs's hardness less than 6 or Knoop hardness less than 900 Kg/mm². Examples of soft particles include, silica, titania, ceria, $MnO_2$, $Mn_2O_3$, $VO_2$, PbO. Hard particles are defined herein as particles with a Mohs hardness higher than 6 or a Knoop hardness higher than 900 Kg/mm². Examples of hard particles include alumina, boron nitride, silicon carbide, silicon nitride and diamond. Soft particles can be either in bulk or in the form of the coating. The concentration of particles can vary from 0.0001 weight percent to 70 weight percent of the slurry of the slurry. As noted above, soft particles can be formed in-situ by the break-down of the oxidizer into insoluble byproducts.

The soft surfaced particles can be what are referred to herein as "coated particles" in some embodiments or "soft functionalized particles" in other embodiments. Soft functionalized particles generally comprise a thin soft surface coating comprising a water insoluble compound of a transition metal on an abrasive surface. Soft functionalization is defined herein as the arrangement where the thickness of the transition metal comprising coating on the core particles is between 0.001 monolayers to 10 monolayers, and comprised of transition metal comprising materials that have a Knoop Hardness of less than 900 Kg/mm² when measured in their bulk form.

The soft surface coating of the soft functionalized particles can be a discontinuous or continuous coating, and its thin nature results in its surface properties generally being different from the core but having a hardness that will generally be similar to the core. In contrast, coated particles have a coating that is generally a continuous coating that is thicker and is typically much thicker (e.g., >10 monolayers to 100,000 monolayers (about 30 microns) as compared to the coating for the soft functionalized particles, and its surface properties surface properties and hardness will generally be controlled by the coating and thus be different from the core.

The presence of disclosed oxidizers leads to unexpectedly high polishing rates. Although not seeking to be bound by theory or needed to practice disclosed embodiments, the high polish rates obtained by disclosed embodiments may be due to catalytic and rapid break down of the oxidizer during polishing process. The pressure of the particles formed during by the rubbing process can accelerate the oxidizer breakdown thus rendering the surface of the III-Nitride into a softer layer that can removed by the pad surface and/or by particles in the slurry resulting in higher polish rates. Accordingly, disclosed embodiments provide new CMP slurries and related methods for polishing group III-N comprising materials which significantly increase the polishing rate and decrease damage to the group III-N comprising surface. If particles surfaces or the polishing pad surfaces are softer than the Group III-Nitride surfaces, no surface damage in terms of scratches or subsurface damage in terms of defects is expected.

The polishing pad can comprise a soft material (Mohs hardness less than 6 or Knoop Hardness less than 900 Kg/mm$^2$). Examples of soft pads include polymeric pads, metallic pads such as copper, tin or iron-like, or silica like materials. Examples of soft pad materials include polymeric-like pads such as the IC series and Suba Series manufactured by Dow Chemical Company, D-100 series manufactured by Cabot Microelectronics.

BRIEF DESCRIPTION OF THE DRAWING

FIG. 1 shows steps in an example CMP method for polishing a group III-N comprising surface, according to an example embodiment.

DETAILED DESCRIPTION

Disclosed embodiments are described with reference to the attached figure. The figure is not drawn to scale and is provided merely to illustrate certain disclosed embodiments. Several disclosed aspects are described below with reference to example applications for illustration. It should be understood that numerous specific details, relationships, and methods are set forth to provide a full understanding of this disclosure. One having ordinary skill in the relevant art, however, will readily recognize disclosed embodiments can be practiced without one or more of the specific details or with other methods. In other instances, well-known structures or operations are not shown in detail to avoid obscuring disclosed details. The embodiments of the invention are not limited by the illustrated ordering of acts or events, as some acts may occur in different orders and/or concurrently with other acts or events. Furthermore, not all illustrated acts or events are required to implement a methodology in accordance with the embodiments of the invention.

FIG. 1 shows steps in an example CMP method 100 for polishing a substrate having a group III-N comprising surface, according to an example embodiment. Step 101 comprises providing a CMP slurry composition. The slurry composition comprises a slurry solution that includes at least one component that reacts with the Group III-nitride comprising surface to form a softened Group III-nitride comprising surface, and optionally also includes slurry particles. The slurry solution comprises i) a liquid (e.g. water) carrier, (ii) and an oxidizer comprising a transition metal element or a per-based compound. In one embodiment the transition metal or per-based compound has an oxidation state of +3 or higher. The transition metal or per-based oxidizers can break down into insoluble byproducts during the polishing process. In one embodiment, the slurry composition includes a plurality of soft or hard particles, or hard particles or soft particles coated with soft surfaces can also be included.

Step 102 comprises contacting the group III-N comprising surface with the slurry composition to form a softened Group III-nitride comprising surface by pressing a pad onto the slurry composition that is on the Group III-N surface. Step 103 comprises moving the pad relative to the softened group III-N comprising surface, wherein at least a portion of the softened group III-N comprising surface is removed. The pad pressure used is generally at least 0.5 psi.

The group III-N comprising surface can generally be of any orientation (001), (110), (111) C-plane, M-plane Polar or non-polar plane. The group III-N comprising surface can be in single crystal form, polycrystalline or amorphous form. In the single crystal form both the nitrogen face and the non-nitrogen faces can either be contacted during polishing. CMP processes according to disclosed embodiments may be based on catalytic breakdown of the oxidizing agent which provides reactive species that increase the removal rate. The catalytic action can be further enhanced by one or more of higher temperature (e.g., 35 to 90° C.), rubbing action during the CMP process, the presence of insoluble compounds and elements of transition metals, functionalization of the surface of slurry particles with insoluble elements or compounds of transition metals, the presence of soluble transition metal ions, an increase in friction during polishing, formation of insoluble transition metal compound during polishing as a result of breakdown of the oxidizer, coating of the polishing pad surface with a transition metal oxide or an insoluble compound, or illuminating the polishing process with a optical lamp whose radiation output can be varied in wavelength from ultraviolet to the infrared.

Examples of oxidizers that can be catalytically accelerated include peroxides, permanganates, perchlorates, and oxidizers containing transition metal elements such as permanganates, ferrocyanides, ferricyanides, chromates, cerium ammonium nitrates. Examples of oxidizers that can breakdown into insoluble compounds of transition elements include permanganates and chromates. Examples of oxidizers that can breakdown into insoluble products that generally coat the polishing pad include, permanganates, and chromates. As described above, the pad coating can be in the form insoluble surface films as a result of byproducts from the slurry.

The catalytic action can be accelerated by a local temperature increase that can occur during the polishing process itself. In another embodiment, the temperature can be increased by providing an external heat source, such as a heated slurry, heating of the pad and polishing apparatus using lamps, or resistively heated source. The catalytic action can also be provided by ultraviolet (UV) breakdown using high photon energy sources such as UV lamps. The catalytic action can be accelerated also by the presence of soluble ions (e.g., transition metal ions of manganese, zinc, chromium, iron, cobalt, copper,) insoluble soft surface compositions (e.g., transition metal (Mn, Cu, Zn, Co, Fe, Ni) oxides, nitrides, chlorides, sulfates, nitrates carbonates (e.g., $MnO_2$, $MnCl_3$, $TiO_2$, $CuO$), or transition metals (Fe, Mn, Zn, Co, Ag)) during the polishing process. The catalytic action can be accelerated by contacting the pad containing the slurry composition with the Group III-Nitride surface and moving the pad relative to the surface. In one embodiment, the contact of the slurry pad with Group III-nitride comprising surface has pressure of 0.5 psi or greater, to accelerate formation of the softened Group III-nitride surface compared to the original Group III-nitride comprising surface. The formation of softened surface can also be accelerated with moving the slurry-pad across the Group III-nitride contacting surface with linear speeds greater than 0.05 m/sec or rounds per minute greater than 5. As noted above, the slurry composition may either contain only liquid, or a plurality of particles in the liquid. In one embodiment the pad may be coated with a insoluble byproduct from the slurry.

As described above, disclosed oxidizers in the presence of soft surfaced particles in slurries or the presence of a soft polymeric polishing pad has been found to unexpectedly provide a high polishing rate for the much harder and highly inert group III-N comprising surface, such as a removal rate ≥100 nm/hr, along with a significant reduction in surface and sub-surface damage as compared to conventional polishing using a harder abrasive. Although not required to practice disclosed embodiments, the Inventors provide herein some mechanisms believed to be operable that can be used to explain the unexpectedly high removal rate provided by CMP processing with the use of soft surfaced particles or a soft polishing pad having a soft surface according to disclosed embodiments.

The catalytic action can be also be accelerated by functionalization to form soft functionalized particles. As defined above, soft functionalized particles generally comprise a soft surface coating portion that is 0.001 monolayers to 10 monolayers thick on an abrasive surface, wherein the soft surface comprises an insoluble compound of a transition metal that has a Knoop Hardness of less than 900 $Kg/mm^2$ when measured in its bulk form.

Examples of soft surfaces can include, water insoluble transition metal comprising compounds, such as oxides, chloride, carbonates, nitrates, sulfates of transition metals. The soft surfaces can also include elements and alloys of transition elements. The transition metals can include copper, or manganese, zinc, iron, titanium, cerium, cobalt, silver located in Periods 4, 5, and 6 of the periodic table. "Soft surface" as used herein can also include certain polymeric materials including PMMA, polystyrene, and polyurethane. In a specific embodiment, the soft surface transition metal compound can comprise an Mn comprising compound in which Mn is in the $Mn^{+0}$ state, or $Mn^{+3}$ or $Mn^{+4}$ oxidation states. For example, the Mn comprising compound can consist essentially of at least one of $MnO_2$ and $MnCl_3$ and thus essentially be the only particles in the slurry. In the case of $MnO_2$ and $MnCl_3$ particles, the estimated Mohs hardness for both of these materials is <3. Such particles generally have a size from 0.5 nm to 100 microns.

The concentration of the soft particles in the slurry can vary from 0.0000001% to 50% by weight. Other examples of soft surfaces include, cerium oxide, zinc oxide, copper oxide, nitrides, carbonates oxides of transition metals, transition metals and forms of silica having a Mohs hardness of ≤6, including nanoporous silica (i.e. having nanosized pores), as well as other nanoporous materials including porous alumina. For example, nanoporous silica particles can be formed by a modified Stober process (W. Stober, A. Fink, E. Bohn, J. Colloids and Interfacial Science, 26, 62-69 (1968)). The particle size in this embodiment can vary from 20 nm to 500 nm, while the porosity can vary from 10 to 60%. As the porosity of the surface increases, the numbers of adsorption sites are expected to decrease.

The particle size of soft surfaced particles can generally vary from 1 nm to 100 microns. In this embodiment, the concentration of particles can vary from 0.000001 weight percent to 50 weight percent of the slurry.

In some disclosed embodiments the soft surface composition can be coated onto a core particle that has a higher hardness, such as a hard abrasive, to form soft surfaced composite particles. In this embodiment, the composite particles can comprise a core having a first hardness and a coating of the soft surface on the core having a second hardness, wherein the second hardness<the first hardness by at least one (1) Mohs number or at least a Knoop hardness of 100 $Kg/mm^2$. For example, if the hardness of the coating has a Mohs number of 3, then the hardness of the core particle is at least a Mohs number of 4. Another example includes if the Knoop hardness of the coatings is 200 K $g/mm^2$, the hardness of the core is at least 300 $Kg/mm^2$. Inorganic core particles for the soft surface coated particles can be silica, titania nanoporous particles, silicon nitride, alumina, yttria, zirconia, diamond, ceria.

Core particles can also be multiphase particles, where the cores are coated or mixed with another layer. The primary size of the core particles can vary from 2 nm to 100 microns. The primary particle size refers to the minimum unaggregated size of the particles. The surface coatings can be continuous or discrete and provide 2% to 100% core particle surface area coverage. The thickness of the soft coatings can vary from 0.5 nm to 500 nm. In one embodiment, the thickness of the solid coating is between 10 nm to 100 nm.

Example of composite particles include coatings of water insoluble compounds of transitions metals (e.g., $MnO_2$, ZnO, cerium oxide, copper oxide, cobalt oxide, iron oxide, chromium oxide, $MnCl_3$, other chlorides, nitrides, carbonates, of transition materials, transition metals) on silica, ceria, alumina, titania, silicon carbide, silicon nitride, boron nitride, or diamond particles. The size of the composite particles is generally from 1 nm to 100 microns. The concentration of composite particles can vary from 0.000001 weight percent to 50 weight percent of the slurry. In yet another embodiment, the particles include soft surface particles and particles having a hard abrasive surface.

Soft functionalized particles typically comprise ultra thin coatings with partial or complete surface coverage which can alter the properties of the particles but may not be visually different from a uncoated particle. In this embodiment, the functionalized particles can comprise a core having a first hardness and a coating of the soft functionalization on the core having a second hardness if measured in bulk form, wherein the second hardness<the first hardness by at least one (1) Mohs number or at least a Knoop hardness of 100 $Kg/mm^2$. For example if the hardness of the functionalized surface material in bulk form has a Mohs number of 3, then the hardness of the core particle is at least a Mohs number of 4. Another example includes if the Knoop hardness of the surface functionalization material in bulk form is 200 $Kg/mm^2$, the hardness of the core particle is at least 300 $Kg/mm^2$. Example of a hard core abrasives include, but are not limited to, silica, alumina, titania, ceria, silicon nitride, silicon carbide, boron nitride and diamond.

Example of functionalized surfaces of core particles include water insoluble compounds of transitions metals (e.g. $MnO_2$, ZnO, cerium oxide, copper oxide, cobalt oxide, iron oxide, $MnCl_3$, other chlorides, nitrides, alkoxides, carbonates, of transition materials, transition metals including zinc, manganese, copper, cobalt, and from period 3, 4 and 5 of the periodic table) on silica, ceria, alumina, titania, silicon carbide, silicon nitride, boron nitride, or diamond particles. The size of the functionalized particles is generally from 1 nm to 100 microns. The concentration of functionalized particles can vary from 0.000001 weight percent to 50 weight percent of the slurry.

The functionalization and coatings on core particles can be achieved by various means including physical vapor deposition, chemical vapor deposition, and wet chemistry methods. Using wet chemistry methods, the core particles can be immersed into a liquid which can breakdown to form insoluble compounds that can functionalize/coat the surface of the core particles. The breakdown of the liquid into insoluble products can occur by external action including addition of at least one other chemical to the slurry solution containing the original chemical and the core particle. The second chemical may help to break down the original chemical to form insoluble compounds that can coat the surface of the particles. The breakdown of the coatings/functionalization chemicals can occur by other means including stirring, heating, presence of light, or keeping the particles mixed with an chemicals for an extended period of time greater than 20 minutes.

In the presence of UV light the time to functionalize the surface will generally be less than 5 minutes. The occurrence of the functionalization can be determined from a change in the property of the functionalized particles including but not limited to change in color of the particle, dispersion characteristics, particle flow behavior, coagulation, optical, electrical magnetic, electronic, mechanical and other properties. One method of observing functionalization/coating is to observe the change in color of the particle or change in dispersion characteristics of the particle. In one embodiment the dispersion characteristics of a silica particle are observed in the acidic pH range (e.g., pH 0.5 to a pH approaching 7). Typically, colloidal silica particles in the pH range of 4 to approaching 7 are unstable and can gel to form large networks of particles that cannot be redispersed. Functionalization of the core abrasive silica particle can reduce or eliminate the gelation process so that the particles can be easily redispersed.

In another embodiment, both coated particles and/or soft functionalized particles may be mixed with abrasives particles such as silica, alumina, zirconia, diamond, boron nitride. The percentage of coated/functionalized particles compared to total particles can vary from 5% to 100%.

The oxidizing agent can comprise a peroxide such as hydrogen peroxide, ammonium cerium nitrate, periodates, periodic acid, iodates, persulfates, chromates, permanganates, ferricyanides, bromates, perbromates, ferrates, perrhenates, perruthenates, and mixtures thereof. In one specific embodiment, the oxidizing agent comprises a water soluble transition metal compound that provides transition metal ions, such as Mn. Examples of water soluble transition metal based oxidizers include permanganates, such as $KMnO_4$. As known in the chemical arts, permanganate is the general name for a chemical compound containing the manganate (VII) ion, ($MnO_4-$). Ferricyanides are another class of water soluble transition metal compounds. As known in the chemical arts, ferricyanide is the anion $[Fe(CN)_6]_3-$. The oxidizers can include compounds after reaction that form insoluble transition metal compounds. For example, the permanganate ion can form insoluble manganese oxide, and chromate based oxidizers can form the chromium oxide.

It is also generally desirable to ensure that the slurry particles do not gel in a colloidal suspension in the normally high ionic strength slurry. The Inventors have found that slurry stability can generally be improved by a surfactant because surfactant covered particles repel one another and as a result tend not to agglomerate. As used herein, the term "surfactant" refers to a material having both a lipophilic component and a hydrophilic component, and includes surface active polymers. As known in the art, surfactants are generally classified by the presence of formally charged groups in its head, with non-ionic, cationic, anionic, and cationic surfactants. If a surfactant contains a head with two oppositely charged groups, it is termed zwitterionic. All surfactant types can generally be used with disclosed embodiments.

The concentration of surfactants used depends on the type of the surfactant used, the surfaces of particles and wafers. At low concentrations, the surfactant may adsorb onto the solid surfaces in a patchy manner and change the electrostatic properties and the surface energy of the surface. The adsorption of the surfactant under these conditions may reduce the etching of the surface layer. At higher concentrations of the surfactant, the surfactant molecules may coalesce together to form self-assembled structures. Examples of structured surfactants can include spheres, cylindrical rods, bi-layers, disks and vesicles. Once the bulk critical micelle concentration (CMC) is reached, the surface tension of the solution does not generally decrease any further, but is accompanied by a rapid drop in the electrical conductivity of the bulk solution.

In one embodiment, the surfactant concentration is at least 0.0001 of the CMC for non-ionic surfactants and at least 0.001 CMC of cationic and anionic surfactants. As described above, the soft coating or soft coating portion may also help ensure non-gelling of the slurry particles.

The slurry may also include other additives including salts, biocides, pH stabilizing agents, and soluble ions of various elements including alkali and transitions metals. For example, the salt can comprise KI, KBr, $KCO_3$, KCl, $NH_4I$ or $NH_4Cl$. The concentration of the salt can range from 0.001 M to 5 M.

The pH of the slurry can vary from 0.1 to 13.9, although during CMP processing the pH of the slurry is generally $\leq 8$, or $<5$, such as from 2 to 5. During storage, particularly when the oxidizing agent comprises permanganate, the pH of the slurry is generally $\geq 8$. To prepare for use, an acid, such as nitric acid can be used to reduce the pH to raise the removal rate as evidenced in the examples described below.

The group III-N comprising surfaces can be in the form of a substrate (e.g. a wafer having a thickness greater than 100 microns) or in the form of a thin or thick film (with a thickness less than 100 microns). The group III-N comprising film can be single crystal, polycrystalline or have an amorphous structure.

Slurries according to embodiments of the invention can be premixed or mixed in situ during the CMP process. As described above, premixed slurries may be stored in alkaline pH conditions and acid added before CMP use. In a typical embodiment, a first and second water soluble composition are dissolved in water which react and form soft insoluble particles or coat core particles if provided in the slurry to form composite particles having a soft surface. The CMP pad is also coated with the insolubles. An oxidizer can be added, or be one of the water soluble compositions provided in stoichiometric excess.

Polishing of group III-N comprising materials according to embodiments of the invention can benefit a wide variety of applications. For example, embodiments of the invention can be used in applications such as dielectric films in semiconductor integrated circuits, optoelectronic devices such as light emitting devices (LEDs), power electronics, high frequency electronics, lasers, microelectromechanical systems (MEMS) based devices, and bio-medical systems.

EXAMPLES

Disclosed embodiments are further illustrated by the following specific examples, which should not be construed as limiting the scope or content of disclosed embodiments in any way. For example, although GaN is described being polished in several of the examples, disclosed embodiments are not limited to GaN.

Example 1

Group III-Nitride Polishing with Transition Metal Oxidizers and Per-Based Oxidizers A group III-N comprising surface was contacted with a CMP slurry composition that comprises i) a liquid (e.g. water) carrier, and an oxidizer with compound of a transition metal or a per-compound. Experiments performed using a polisher from CETR (now Bruker Corporation) with oxidizer concentration of 0.05 molar, 5% silica particles with particle size of 75 nm with 3.2 psi (pressure), rpm of 100, using a SUBA IV™ pad supplied by Dow Electronic Company. The substrate was a single crystal gallium nitride with a Ga faced surface. The polishing runs were conducted for 30 minutes.

| No | Oxidizer | pH | Removal rate |
|---|---|---|---|
| 1 | Cerium ammonium nitrate | 2 | 43 nm/hr |
| 2 | Potassium Perchlorate | 2 | 72 nm/hr |
| 3 | Potassium iodate | 2 | 58 nm/hr |
| 4 | Iron III nitrate monohydrate | 2 | 10 nm/hr |
| 5 | Potassium peroxymonosulfate | 2 | 96 nm/hr |
| 6 | Cerium III nitrate hexahydrate | 2 | 48 nm/hr |
| 7 | Potassium ferricyanide | 2 | 48 nm/hr |
| 8 | Potassium di Chromate | 2 | 48 nm/hr |
| 9 | Zinc Oxide | 2 | 30 nm/hr |
| 10 | Chromium III Oxide | 1.86 | <10 nm/hr |
| 11 | Chromium IV Oxide | 1.38 | 43 nm/hr |
| 12 | Ferric Chloride | 1.5 | <10 nm/hr |
| 13 | Sodium Hypochlorite | 11.04 | 29 nm/hr |
| 14 | Potassium Periodate | 1.96 | 87 nm/hr |
| 15 | Cupric sulfate | 1.99 | 38. nm/hr |
| 16 | Cobaltous sulfate | 2 | <10 nm/hr |
| 17 | Sodium phosphate | 2 | 24 nm/hr |
| 18 | Ammonium Phosphate | 2 | 24 nm/hr |
| 19 | Ammonium persulfate | 1.51 | 38 nm/hr |
| 20 | Potassium permanganate | 1.96 | 34 nm/hr |

Example 2

Experiments were performed using a polisher from Buehler Corporation, AUTOMET 2 with an oxidizer concentration of 0.05 molar, 5% silica particles with particle size of 75 nm with a pressure of 5 psi, 90 rpm, using SUBA IV™ pad supplied by Dow Electronic Company. The surface that was polished was the Al face of an aluminum nitride single crystal.

| No | Oxidizer | pH | Removal rate |
|---|---|---|---|
| 1 | Cerium ammonium nitrate | 2 | 900 nm/hr |
| 2 | Potassium Perchlorate | 2 | 3300 nm/hr |
| 3 | Potassium m-iodate | 2 | 1200 nm/hr |
| 4 | Iron III nitrate nanohydrate | 2 | 3000 nm/hr |
| 5 | Potassium peroxymonosulfate | 2 | 4000 nm/hr |
| 6 | Cerium III nitrate hexahydrate | 2 | 2100 nm/hr |
| 7 | Potassium ferricyanide | 2 | 14580 nm/hr |
| 8 | Potassium permanganate | 2 | 5100 nm/hr |

Example 3

Polishing with Hard Particles or Hard Particle Coated with Soft Particle, or Two Soft Particles Coated with Each Other.

The group III-N comprising surface was contacted with a CMP slurry composition that comprises i) a liquid (e.g. water) carrier, an oxidizer with compound of a transition metal per-compound with hard particles which includes SiC, diamond, silica, and titania. Experiments performed using the Buehler polisher mentioned above with oxidizer, $KMnO_4$ concentration of 0.4 molar, different hard particles with 6.2 psi (pressure), rpm of 90 using D100 pad supplied by Cabot Microelectronics Company. The gallium nitride surface with a Ga face surface was polished.

Example 4

Experiments were performed without the use of ex-situ-particles. The group III-N nitride comprising surface was contacted with a CMP slurry composition that comprises i) a liquid (e.g. water) carrier, an oxidizer comprising the transition metal per-compound $KMnO_4$. Experiments were performed using polisher from CETR (now Bruker Corporation) at 6.3 psi, 100 rpm using IC 1000 PAD™ supplied by Dow Electronic Company using either a Ga faced GaN surface or Al faced AN surface.

| No | Sample | Oxidizer Concentration | pH | Removal rate |
|---|---|---|---|---|
| 1 | Gallium Nitride | 0.1 | 7 | 10 nm/hr |
| 2 | Gallium Nitride | 0.1 | 2 | 365 nm/hr |
| 3 | Aluminum Nitride | 0.2 | 2 | 2000 nm/hr |
| 4 | Aluminum Gallium Nitride | 0.1 | 2 | 1700 nm/hr |

Example 5

Use of Surfactants and Salt Addition in Slurry

The group III-N comprising surface is contacted with a CMP slurry composition that comprises i) a liquid (e.g. water) carrier, an oxidizer with compound of a transition metal per-compound, and additionally with a salt or surfactant. Experiments performed using polisher from CETR with 3.5 psi pressure, Suba IV™ pad on Ga face of Gallium Nitride and the Al face of Aluminum Nitride samples using a potassium permanganate oxidizer.

| | Sample | Oxidizer | pH | Removal rate |
|---|---|---|---|---|
| 2 | Gallium Nitride | Potassium permanganate + 0.01 CTAB | 10 | 10 nm/hr |
| 3 | Gallium Nitride | Potassium permanganate + 0.01 wt % flouro surfactant 3M | 2 | 36 nm/hr |
| 4 | Gallium Nitride | Potassium permanganate + 0.05 mol Potassium Chloride | 2 | 58 nm/hr |
| 5 | Gallium Nitride | Potassium permanganate + 0.05 mol Potassium Chloride | 2 | 20 nm/hr |
| 6 | Aluminum Nitride | Potassium permanganate + Sodium Dodecyl sulphate (0.01 mole) | 2 | 3600 nm/hr |
| 7 | Aluminum Nitride | Potassium permanganate + 0.01 CTAB | 10 | 4200 nm/hr |

While various disclosed embodiments have been described above, it should be understood that they have been presented by way of example only, and not limitation. Numerous changes to the disclosed embodiments can be made in accordance with the disclosure herein without departing from the spirit or scope of the invention. Thus, the breadth and scope of the disclosed embodiments of should not be limited by any of the above described embodiments. Rather, the scope of the invention should be defined in accordance with the following claims and their equivalents.

Although this Disclosure has been illustrated and described with respect to one or more implementations, equivalent alterations and modifications will occur to others skilled in the art upon the reading and understanding of this specification and the annexed drawings. In addition, while a particular disclosed feature may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A method of chemically-mechanically polishing a substrate having a Group III-nitride comprising surface, comprising:
    providing a chemical-mechanical polishing slurry composition, said slurry composition comprising:
        a slurry solution including a liquid carrier, an oxidizer comprising a per-based compound in a concentration range from 0.05 M to 0.4 M, in a pH range from 1 to 7, and a plurality of coated particles having a hard core and a soft surface that provides a lower hardness compared to said hard core by at least one (1) Mohs number or at least a Knoop hardness of 100 Kg/mm$^2$, wherein said lower hardness is less than a 6 Mohs number or a Knoop hardness less than 900 Kg/mm$^2$, wherein said slurry solution includes at least one component that reacts with said Group III-nitride comprising surface to form a softened Group III-nitride comprising surface;
    dispensing said slurry composition to contact said Group III-nitride comprising surface to form said softened Group III-nitride comprising surface by pressing a polymeric polishing pad having a Mohs hardness less than 6 or Knoop Hardness less than 900 Kg/mm$^2$ onto said Group III-nitride comprising surface, and
    moving said polishing pad relative to said softened Group III-nitride comprising,
    wherein at least a portion of said softened Group III-nitride comprising surface is removed.

2. The method of claim 1, wherein said per-based compound breaks down into at least one insoluble byproduct during said method, and wherein said insoluble byproducts coat said polishing pad with a coating following said dispensing.

3. The method in claim 1 where said per-based compound comprises a permanganate.

4. The method of claim 1, wherein said soft surface comprises a Mn comprising compound in which Mn is in a Mn$^{+3}$ or Mn$^{+4}$ state.

5. The method of claim 4, wherein said Mn comprising compound consists essentially of at least one of MnO$_2$, MnCl$_3$, and Mn$_2$O$_3$.

6. The method of claim 5, wherein said Mn comprising compound comprises at least two of said MnO$_2$, said MnCl$_3$ and said Mn$_2$O$_3$.

7. The method of claim 2, wherein said coating comprises a discontinuous coating.

8. The method of claim 2, wherein said coating comprises a continuous coating.

9. The method of claim 1, wherein a pH during said method is <3.

10. The method of claim 1, wherein said group III-nitride comprising surface comprises GaN.

11. The method of claim 1, wherein said group III-nitride comprising surface consists essentially of a Group III-nitride surface, and a polishing rate for said Group III-nitride surface is ≥100 nm/hr.

12. A method of chemically-mechanically polishing a substrate having a Group III-nitride comprising surface, comprising:
    providing a chemical-mechanical polishing slurry composition, said slurry composition comprising:
        a slurry solution including a liquid carrier, an oxidizer comprising a per-based compound, in a concentration range from 0.05 M to 0.4 M, in a pH range from 1 to 7, and a plurality of particles having a soft surface including Mn comprising compounds in which Mn is in a Mn$^{+3}$ and in a Mn$^{+4}$ state, wherein said slurry solution includes at least one component that reacts with said Group III-nitride comprising surface to form a softened Group III-nitride comprising surface;
    dispensing said slurry composition to contact said Group III-nitride comprising surface to form said softened Group III-nitride comprising surface by pressing a polishing pad onto said Group III-nitride comprising surface, and
    moving said polymeric polishing pad having a Mohs hardness less than 6 or Knoop Hardness less than 900 Kg/mm$^2$ relative to said softened Group III-nitride comprising,
    wherein at least a portion of said softened Group III-nitride comprising surface is removed.

13. The method of claim 12, wherein said Mn comprising compounds include both MnO$_2$ and MnCl$_3$.

14. The method of claim 1, wherein said pH range is from 1 to 5.

15. The method of claim 12, wherein said wherein said pH range is from 1 to 5.

* * * * *